(12) United States Patent
Hartmann et al.

(10) Patent No.: US 6,958,696 B2
(45) Date of Patent: Oct. 25, 2005

(54) TRANSFER FUNCTION SYSTEM FOR DETERMINING AN IDENTIFIER ON A SURFACE ACOUSTIC WAVE IDENTIFICATION TAG AND METHOD OF OPERATING THE SAME

(75) Inventors: Clinton S. Hartmann, Dallas, TX (US); John C. Bellamy, Coppell, TX (US)

(73) Assignee: RF Saw Components, Inc., Richardson, TX (US)

( * ) Notice: Subject to any disclaimer, the term of this patent is extended or adjusted under 35 U.S.C. 154(b) by 0 days.

(21) Appl. No.: 10/268,108

(22) Filed: Oct. 9, 2002

(65) Prior Publication Data

US 2004/0075560 A1 Apr. 22, 2004

(51) Int. Cl.$^7$ .............................................. G08B 13/14
(52) U.S. Cl. .............................. 340/572.1; 340/572.7; 340/10.1; 310/313 D
(58) Field of Search .......................... 340/572.1, 572.4, 340/572.7, 10.1, 10.3, 10.41, 572.2, 10.42; 310/313 B, 313 C, 313 D, 313 R, 313 A; 235/454, 455; 342/42, 51, 43, 50

(56) References Cited

U.S. PATENT DOCUMENTS

| 5,734,326 A | * | 3/1998 | Skudera, Jr. ............. 340/572.1 |
| 5,821,425 A | * | 10/1998 | Mariani et al. ................ 73/703 |
| 6,407,695 B1 | * | 6/2002 | Stierlin et al. ................ 342/42 |
| 6,433,671 B1 | * | 8/2002 | Nysen ..................... 340/10.41 |
| 6,455,979 B2 | * | 9/2002 | Reindl et al. ............ 340/572.1 |
| 6,633,226 B1 | * | 10/2003 | Nysen ....................... 340/10.1 |

* cited by examiner

Primary Examiner—Van T. Trieu

(57) ABSTRACT

A transfer function system for determining an identifier on a surface acoustic wave (SAW) identification tag and a method of operating the same. In one embodiment the system provides for (1) generating a radio frequency (RF) interrogation signal that causes a transducer located on a piezoelectric substrate to produce an initial acoustic pulse that reflects off of a plurality of reflectors arranged according to time and phase position on the substrate to yield response acoustic pulses, the transducer generating an RF response signal from the response acoustic pulses; and (2) determining the identifier by decoding the RF response signal in view of predefined time, phase and amplitude parameters.

20 Claims, 2 Drawing Sheets

TRANSFER FUNCTION SYSTEM FOR DETERMINING AN IDENTIFIER ON A SURFACE ACOUSTIC WAVE IDENTIFICATION TAG AND METHOD OF OPERATING THE SAME

TECHNICAL FIELD OF THE INVENTION

The present invention is directed, in general, to a system for determining an identifier on an identification tag and, more specifically, to a transfer function system for determining an identifier on a surface acoustic wave (SAW) identification tag.

BACKGROUND OF THE INVENTION

To address and overcome inherent existing limitations in prior art radio frequency identification (RFID) tags with respect to cost, data capacity and reliable range, a new RFID tag technology has been developed. This new technology utilizes surface acoustic wave (SAW) devices as identification tags and is described in detail in U.S. patent application Ser. No. 10/066,173, entitled "Surface Acoustic Wave Identification Tag Having Enhanced Data Content and Methods of Operation and Manufacture Thereof," Harhnann, Clinton S. ("Hartmann One"), commonly assigned with the invention and incorporated herein by reference. The principles used to encode data on SAW tags involving simultaneous phase and time shift modulation is described in detail in U.S. patent application Ser. No. 10/062,833, entitled "Modulation by Phase and Time Shift Keying and Method of Using the Same," Hartmann, Clinton S. (Hartmann-Two), also commonly assigned with the invention and incorporated herein by this reference. The principles used to encode data by combining multi-pulse per group modulation with simultaneous phase and time shift modulation is described in detail in U.S. patent application Ser. No. 10/062,894, entitled "Modulation by Combined Multi-pulse per Group with Simultaneous Phase and Time Shift Keying and Method of Using the Same," Hartmann, Clinton S. (Hartrnann-Three), also commonly assigned with the invention and incorporated herein by reference. Additional pertinent information regarding SAW identification tags and SAW identification tag readers is set forth in detail in U.S. patent application Ser. No. 10/066,249, entitled "Reader for a High Information Capacity Saw Identification Tag and Method of Use Thereof," Hartmann, Clinton S. ("Hartmann Four"), again commonly assigned with the invention and incorporated herein by reference.

An interrogated RFID tag reflects or retransmits a radio signal in response to an interrogation signal. The returned or reply signal contains the data that, when decoded, identifies the tag and any object with which the tag is associated. A SAW device used as an identification tag can be encoded with a large amount of data. When encoded with 64 or 96 bits of data, in accordance with certain electronic product code (EPC) specifications, if such tags are to be useful, a reliable system and procedure to accurately identify the tag from a distance is required.

The problem can be best understood in the context of a user that has a large number of objects, each with its own unique identification tag. In order to identify a specific object among the large number of objects, the user will send an interrogation signal to be simultaneously received by a tag on each of the objects. When each responds to the interrogation signal, there will be a large quantity of data from which the signal from a single tag must be isolated and identified. Thus, it is important for that SAW tags be encoded in a manner that tags can be readily distinguished from one another. A system is needed that can be used to encode SAW tags with unique data that can readily be distinguished from the data encoded on other SAW tags.

Accordingly, what is needed in the art is a reliable system for determining the unique identifier encoded on a SAW identification tag that can be readily decoded to identify the object with which it is associated.

SUMMARY OF THE INVENTION

To address the above-discussed deficiencies of the prior art, the present invention provides a transfer function system for determining an identifier on a surface acoustic wave (SAW) identification tag and a method of operating the same. In one embodiment the system provides for (1) generating a radio frequency (RF) interrogation signal that causes a transducer located on a piezoelectric substrate to produce an initial acoustic pulse that reflects off of a plurality of reflectors arranged according to time and phase position on the substrate to yield response acoustic pulses, the transducer generating an RF response signal from the response acoustic pulses; and (2) determining the identifier by decoding the RF response signal in view of predefined time, phase and amplitude parameters.

The present invention thus provides a system for determining the unique identifier encoded on a SAW identification tag. The system takes advantage of certain known characteristics of SAW tags, which are passive devices, to produce characteristically predictable responses when excited by an interrogation signal. Because the interrogation signal includes certain predetermined characteristics that will be affected predictably by reflectors located on the SAW tag, an analysis of this reflected response signal reveals the SAW tag's configuration. That is, the response signal includes SAW tag characteristics that are transferred to the interrogation signal. Thus, because the characteristics of the interrogation pulse are known, the possible SAW tag responses to an interrogation pulse are also known; thus permitting a specific SAW tag to be identified based on a transfer of information to the interrogation signal by the SAW tag.

In one embodiment of the invention, the RF interrogation signal has a carrier frequency of about 2.44 GHz. Of course, any other carrier frequency can be used and still be within the intended scope of the present invention. In a particularly useful and versatile embodiment, the system provides for a group of reflector locations on the substrate. One aspect of this embodiment provides for a plurality of such groups to be located on the substrate. Yet another aspect provides for a group to be made up of 21 reflector locations with two reflectors arranged therein separated from each other by a minimum of ten reflector locations. In still another aspect, the group is comprised of 16 reflector slot locations with a single reflector arranged therein.

In one embodiment of the system, fourteen groups of reflector locations are located on the substrate. A useful feature of this embodiment is that up to 80 bits of data can be encoded on the identification tag. In another embodiment of the invention, nineteen groups are located on the substrate, permitting up to 112 bits of data to be encoded on the identification tag.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
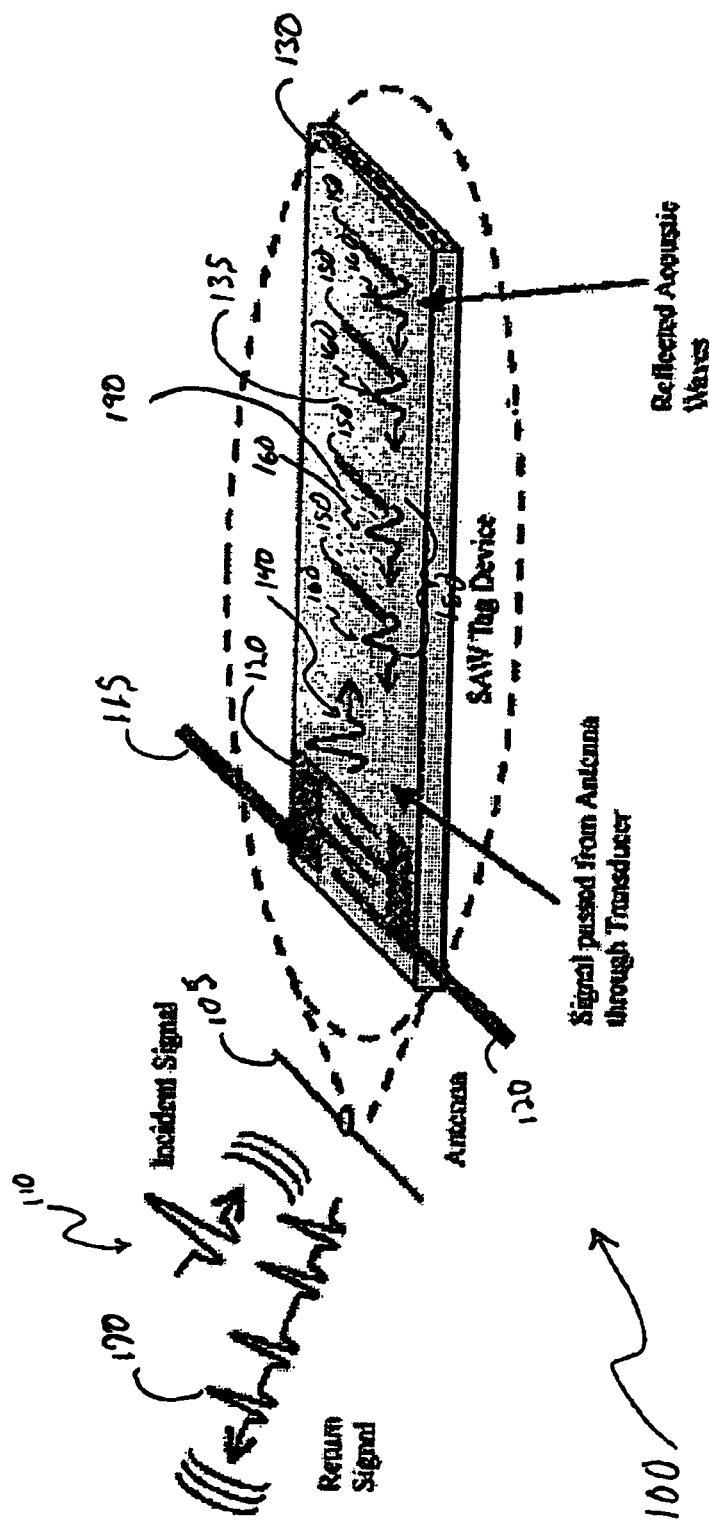
FIG. 1 illustrates a surface acoustic wave (SAW) tag typical of a type that can be used as a radio frequency identification (RFID) tag.

Referring initially to FIG. 1, illustrated is a surface acoustic wave (SAW) tag 100 typical of the type that can be used as a radio frequency identification (RFID) tag. The illustrated embodiment provides for a reader antenna 105 that transmits a radio frequency (RF) interrogation signal 110. The RF signal 110 is received by an antenna 115 on the tag 100 and excites a transducer 120 located on a piezoelectric substrate 130 so that it produces an initial acoustic pulse 140. As the initial acoustic pulse 140 moves down the surface 135 of the substrate 130, it encounters reflectors 150 located thereon, causing a reflection of a portion of the initial acoustic pulse 140. This reflected pulse is called a response acoustic pulse 160 herein.

A feature of the illustrated embodiment is that a plurality of reflectors 150 are arranged on the substrate 130 according to time and phase position to yield a plurality of response acoustic pulses 160. When the transducer 120 receives these response acoustic pulses 160, an RF response signal 170 is generated that is transmitted through the antenna 115 to be detected by a reader antenna 105. The reader (not illustrated) then utilizes the system described herein to determine the identifier in view of predefined time, phase and amplitude parameters detected in the response acoustic pulses 160.

The present system thus defines an identifier encoded on a SAW tag 100 by its "transfer function"; that is, the signal received is determined by the SAW tag's 100 impulse response to the interrogation signal. Defining a SAW tag 100 by its transfer function approach is an appropriate methodology because SAW tags 100 are passive devices that react to and reflect energy that is derived from the impinging signal. Because identifier encoded on the SAW tag 100 is unique, the response signal 170 will also be unique and the data encoded thereon can be uniquely determined based on the transfer function of the SAW tag 100. Thus, it is the transfer of SAW tag 100 features to the interrogation signal 110, which features appear in the RF response signal 170 pattern that defines the code embedded on a SAW identification tag 100.

The efficiency of using a transfer function methodology to define a SAW tag 100 response is evident when contrasted with the more usual "air interface" methodology for defining a signal response. With air interface methodology a signal is defined without reference to either the sending or responding devices, which is logical if both such devices are active. In the case of SAW tags 100, however, using air interface methodology to define signals would, by necessity, also require an analysis of the SAW tag's 100 effect on the interrogation signal 110 because a SAW tag is passive and only responds to a signal stimulus. Thus, the usual signal processing methods relying on an air interface approach for defining a SAW tag 100 would require the transfer function to be embedded in the definition of the interrogation signal 110 as well as the concomitant response signal 170.

An air interface methodology would be inefficient in describing the specification of a SAW tag 100 because it would serve to over-specify the essential requirements being used for identification purposes. Specifying a SAW tag 100 by its transfer function permits the use of a variety of approaches in designing SAW tag readers because there is no limitation on the type of interrogation signal 110 that can be used with the only real constraint being that the interrogation signal 110 must meet the appropriate governmental mandated emission requirements. Within this constraint, any signal can be used that will produce a response signal 170 with sufficient information to detect the reflection pattern embedded in the SAW tag 100. Interrogation signals such as, for example, (i) individual narrow pulses (e.g. impulses); (ii) spectrum measurements for detecting the returning amplitude and phase of multiple, individual tones; (iii) swept frequency (e.g. chirp) signals; and (iv) coded (e.g. direct sequence) spread spectrum signals can all be used as interrogation signals.

The present invention thus provides a system for determining the unique identifier encoded on a SAW identification tag 100 that takes advantage of known characteristics of the SAW tag 100 to produce a characteristically predictable response when excited by a variety of types of interrogation signals. Because response characteristics are affected predictably by reflectors 150 located on the surface 135 of the SAW tag 100, it is an analysis of this reflected response signal 170 that reveals the configuration unique to the interrogated SAW tag 100. In one embodiment of the invention the RF interrogation signal 110 utilizes a carrier frequency of about 2.44 GHz. Of course, any other carrier frequency can be used and still be within the intended scope of the present invention provided the SAW tag 100 characteristics are described in terms of the SAW tag 100 transfer function when any such other carrier frequency is used.

In one embodiment of the present invention, transfer function of a SAW tag 100 is defined in view of the externally observable values of time, phase, amplitude and data order. As an externally observable value, time is concerned with the time between RF response signals 170 and implies that such time takes into consideration the internal round-trip propagation travel time between two reflectors 150 (or between a transducer 120 and reflector 150). If the internal propagation time between two reflectors 150 is t seconds, the externally observable value is 2t seconds. In formulating the architecture of a SAW tag 100, time is generally specified relative to the interrogation signal 110 pulse duration. Thus, a value represented as 0.1T means a time duration equal to one-tenth of the duration of the interrogation signal 110 pulse. Unless otherwise specified, it is generally understood that time is measured from the center of a pulse.

In considering externally observable phase value, the internal reflection phase and the phase shift in the interrogation signal 110, as propagated by the transducer 120 as the initial acoustic pulse 140, reflected as the RF response signal 170 must be jointly considered. Phase shift arising from internal propagation is dependent on the carrier frequency for the interrogation signal 110, which, as noted above, is assumed to be 2.44 GHz (the middle of the ISM band) for the purpose of this description. As will be understood by those of ordinary skill in the pertinent art, however, if a different carrier frequency is used as an interrogation signal 110, the externally observable phase values must be correspondingly adjusted.

For the purpose of defining an externally observable RF response signal 170 in terms of the structural parameters of a SAW tag 100, the amplitude of the RF response signal 170 is specified by assuming the initial acoustic pulse 140 has an amplitude of 1.0 and a comparative number being used for the reflected response acoustic pulse 160. Any specified pulse amplitude must take into consideration any internal aspects of propagation attenuation, reflection coefficients, and transmission loss.

When using externally observable values to define transfer function of a SAW tag 100, it is necessary to make certain assumptions regarding how the data and data fields are presented in the signal. For the purpose of this description, it is assumed that the least significant bit (lsb) will be placed on the right and the most significant bit (msb) on the left which implies that the order of transmission of data will be the msb first. As will be understood by those of ordinary skill in the pertinent art, different assumptions on how data and data fields are presented in the signal can be made and still be within the intended scope of the present invention.

A particularly useful and versatile embodiment of the present invention provides for the system to have a group 180 of reflector locations 190 on the substrate 130. Thus, the SAW tag 100 can be designed to produce an external observable value based on the transfer function of the SAW tag 100 as defined by the location of reflectors 150 in a group 180 of predetermined reflector locations 190. In one embodiment of the present invention, the system provides for an encoding algorithm of a group 180 of 21 reflector locations 190 having two reflectors 150 arranged therein separated by a minimum of ten reflector locations 190. The two reflectors 150 are separated by a minimum of 10 reflector locations 190 to preclude significant overlap between response acoustic pulses 140. Additional pulse separation can be achieved by increasing the number of reflector locations 190 between pulses. As here in after explained, this "2-of-21"embodiment provides the capability for encoding multiple bits of data that can be decoded with a small number of response acoustic pulses 140. Although other encoding algorithms may allow more data to b e encoded in less space, the 2-of-21 system provides the advantage of encoding simplicity, flexibility and the possibility of an increased uniformity in amplitude of response acoustic pulses 140.

As an aid in determining and selecting reflector locations 190 from a group 180 of closely spaced locations 190 on a SAW tag 100, adjacent locations 190 provide for different phase values for a reflected response acoustic pulse 140. Table 1 defines the reflector locations 190 and the relative reflection phases assigned for an embodiment encoded using the 2-of-21 system.

TABLE 1

Twenty-one Position Encoding Group

| | | |
|---|---|---|
| 1 | 0 | 0.0 |
| 2 | −64 | 0.1 |
| 3 | −128 | 0.2 |
| 4 | −192 | 0.3 |
| 5 | −256 | 0.4 |
| 6 | −320 | 0.5 |
| 7 | −24 | 0.6 |
| 8 | −88 | 0.7 |
| 9 | −152 | 0.8 |
| 10 | −216 | 0.9 |
| 11 | −280 | 1.0 |
| 12 | −344 | 1.1 |
| 13 | −48 | 1.2 |
| 14 | −112 | 1.3 |
| 15 | −176 | 1.4 |
| 16 | −240 | 1.5 |
| 17 | −304 | 1.6 |
| 18 | −8 | 1.7 |

TABLE 1-continued

Twenty-one Position Encoding Group

| | | |
|---|---|---|
| 19 | −72 | 1.8 |
| 20 | −136 | 1.9 |
| 21 | −200 | 2.0 |

This embodiment provides for reflector locations 190 nominally spaced at intervals equal to ten per cent of the width of the interrogating pulse expressed as a unit of time. As those of ordinary skill in the pertinent art will understand, other phase positions, times, and reflector locations 190 can be used and still be within the intended scope of the present invention.

With twenty-one potential locations 190 and a minimum spacing of ten locations 190 between reflectors 150, there are 66 data combinations that can be decoded with two response acoustic pulses 160. As shown in the following Table 2, sixty-four of these combinations can be used to represent 6 bits of information.

TABLE 2

Two of Twenty-one Data Encoding

| Code # | Code | Pulse 1 | Pulse 2 |
|---|---|---|---|
| 1 | 000000 | 1 | 11 |
| 2 | 000001 | 1 | 12 |
| 3 | 000011 | 1 | 13 |
| 4 | 000010 | 1 | 14 |
| 5 | 000110 | 1 | 15 |
| 6 | 000111 | 1 | 16 |
| 7 | 000101 | 1 | 17 |
| 8 | 000100 | 1 | 18 |
| 9 | 001100 | 1 | 19 |
| 10 | 001101 | 1 | 20 |
| 11 | 001111 | 1 | 21 |
| 12 | 001110 | 2 | 21 |
| 13 | 001010 | 2 | 20 |
| 14 | 001011 | 2 | 19 |
| 15 | 001001 | 2 | 18 |
| 16 | 001000 | 2 | 17 |
| 17 | 011000 | 2 | 16 |
| 18 | 011001 | 2 | 15 |
| 19 | 011011 | 2 | 14 |
| 20 | 011010 | 2 | 13 |
| 21 | 011110 | 2 | 12 |
| 22 | 011111 | 3 | 13 |
| 23 | 011101 | 3 | 14 |
| 24 | 011100 | 3 | 15 |
| 25 | 010100 | 3 | 16 |
| 26 | 010101 | 3 | 17 |
| 27 | 010111 | 3 | 18 |
| 28 | 010110 | 3 | 19 |
| 29 | 010010 | 3 | 20 |
| 30 | 010011 | 3 | 21 |
| 31 | 010001 | 4 | 21 |
| 32 | 010000 | 4 | 20 |
| 33 | 110000 | 4 | 19 |
| 34 | 110001 | 4 | 18 |
| 35 | 110011 | 4 | 17 |
| 36 | 110010 | 4 | 16 |
| 37 | 110110 | 4 | 15 |
| 38 | 110111 | 4 | 14 |
| 39 | 110101 | 5 | 15 |
| 40 | 110100 | 5 | 16 |
| 41 | 111100 | 5 | 17 |
| 42 | 111101 | 5 | 18 |
| 43 | 111111 | 5 | 19 |
| 44 | 111110 | 5 | 20 |
| 45 | 111010 | 5 | 21 |
| 46 | 111011 | 6 | 21 |
| 47 | 111001 | 6 | 20 |
| 48 | 111000 | 6 | 19 |

TABLE 2-continued

Two of Twenty-one Data Encoding

| Code # | Code | Pulse 1 | Pulse 2 |
|---|---|---|---|
| 49 | 101000 | 6 | 18 |
| 50 | 101001 | 6 | 17 |
| 51 | 101011 | 6 | 16 |
| 52 | 101010 | 7 | 17 |
| 53 | 101110 | 7 | 18 |
| 54 | 101111 | 7 | 19 |
| 55 | 101101 | 7 | 20 |
| 56 | 101100 | 7 | 21 |
| 57 | 100100 | 8 | 21 |
| 58 | 100101 | 8 | 20 |
| 59 | 100111 | 8 | 19 |
| 60 | 100110 | 8 | 18 |
| 61 | 100010 | 9 | 19 |
| 62 | 100011 | 9 | 20 |
| 63 | 100001 | 9 | 21 |
| 64 | 100000 | 10 | 21 |
| 65 |  | 10 | 20 |
| 66 |  | 11 | 21 |

Another useful encoding algorithm is the 1-of-16 encoding format. This provides for a single reflector 140 located in one of sixteen reflector locations 190 and can be used to encode four bits of data. Table 3 lists the phase values for each location 190 and the code that each such location 190 represents for one embodiment of this algorithm.

TABLE 3

Sixteen Position Encoding Group

| Pulse Position | Phase Value (degrees) | Relative Delay (T) | Code |
|---|---|---|---|
| 1 | 0 | 0.0 | 0000 |
| 2 | −64 | 0.1 | 0001 |
| 3 | −128 | 0.2 | 0011 |
| 4 | −192 | 0.3 | 0010 |
| 5 | −256 | 0.4 | 0110 |
| 6 | −320 | 0.5 | 0111 |
| 7 | −24 | 0.6 | 0101 |
| 8 | −88 | 0.7 | 0100 |
| 9 | −152 | 0.8 | 1100 |
| 10 | −216 | 0.9 | 1101 |
| 11 | −280 | 1.0 | 1111 |
| 12 | −344 | 1.1 | 1110 |
| 13 | −48 | 1.2 | 1010 |
| 14 | −112 | 1.3 | 1011 |
| 15 | −176 | 1.4 | 1001 |
| 16 | −240 | 1.5 | 1000 |

Figure 2:
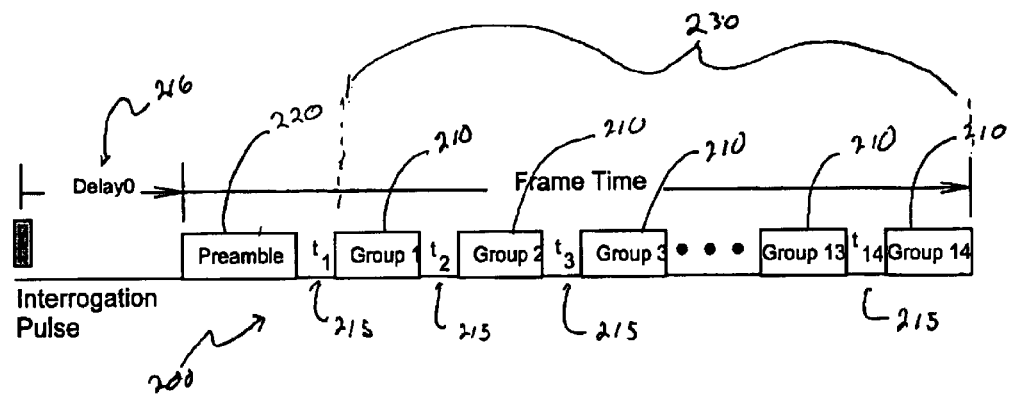
FIG. 2 illustrates a representative layout of an embodiment of a SAW tag utilizing fourteen groups of reflector locations on the substrate to encode up to 80 bits of data.

Turning now to FIG. 2, illustrated is a representative layout 200 of an embodiment of a SAW tag utilizing fourteen groups 210 of reflector locations on the substrate to encode up to 80 bits of data. In the illustrated embodiment, the first twelve groups 210 use 2-of-21 encoding while the last two groups 210 use 1-of-16. Thus the fourteen groups 210 provide for 80 bits of data encoding (12×6 plus 2×4= 80). As will be understood by those of ordinary skill in the pertinent art, the 80 bits of data can be structured to provide for 64 bits of code (as may be required by relevant electronic product code (EPC) specifications), leaving 16 bits of data to be used for error checking, frame and phase synchronization, and SAW tag version information.

In the illustrated layout 200, a preamble 220 precedes data groups 230 and provides for functions such as frame and phase synchronization as well as providing data space for SAW tag version information. The fourteen groups 210 are separated by time values 215 (labeled $t_1$ through $t_{14}$). Each time value 215 interval represents the time between the center of the last reflector position in one group 210 to the center of the first reflector position of the next group 210. Also shown is a time delay value 216 (labeled as Delay0), before a reflector can produce a response acoustic pulse to an interrogation signal. This delay provides separation between the SAW tag response and other relatively high energy reflections of the interrogation signal. It also provides for a method to distinguish between separate classes of SAW tags. For example a warehouse user of SAW tags may identify three primary applications, such as palettes, cases, and items. In the interest of maximizing the ability to detect a tag in one class in the presence of one or more tags from another class, differing amounts of initial delay can be established. Other methods of distinguishing SAW tag versions include preamble 220 formatting and error checking. In the case of preamble formatting, different versions can be defined by modifying preamble pulse separations, phase encoding, or combinations thereof. In the case of error checking, if a valid check sum is not obtained while assuming one version, the return signal can be processed using other assumed versions until a valid check sum occurs.

An advantageous method for distinguishing between SAW identification tags is to scramble the data and data fields on the SAW identification tags. When a series of SAW identification tags are manufactured using sequential coded numbers, the difference in response signals returned by two sequentially numbered SAW tags would be minimal. To facilitate the ability to distinguish between similarly coded SAW tags, the data encoded thereon can be scrambled to create widely different pulse patterns for each code on a SAW tag without changing such data such as the header, object, and msb. The use of differing pulse patterns will facilitate identifying individual SAW tags in an ensemble of SAW tags. Further facilitation can be achieved by increasing the scrambled pulse separation.

In order to illustrate the scrambling concept, assume a series of SAW tags are produced having encoded thereon 64-bits of data and 16-bits of error correction for an aggregate payload of 80 bits. Before the 80-bit payload data is encoded into all fields except B0, B1,B2, B3 and EC, the other fields are scrambled by bit-by-bit "exclusive OR" of these fields with the twelve bits of B0 and B1. Multiple versions of scrambling codes are created by end-around shifting of B0 and B1. A designation of SN0-i indicates an end-around shift to the left of i bit positions of B0 (the lsb of B0 appears i bit positions to the left). Similarly, a designation of B1-i indicates an end-around shift to the left of i bit positions of B1. Table 4 identifies the scrambled fields and the particular shift value of B0 or B1 used to scramble the respective fields. The output codes of the scrambling processes are designated in sub-fields of a 40-bit codeword S. Sub-fields S0 to S5 are six bits in length while sub-field S6 is four bits in length which is produced by exclusive "OR"ing B10 with the four lsb of B0.

TABLE 4

64-Bit Scrambling Process

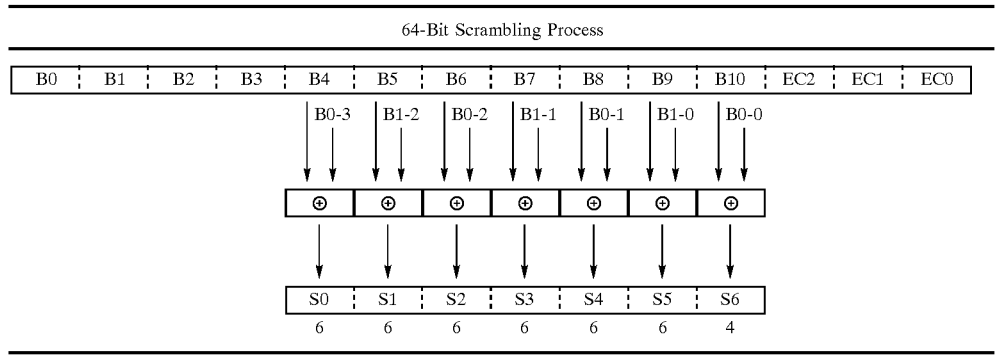

The SAW tag codes are scrambled to create widely different pulse patterns for each code in a series of closely related tags despite the fact that certain fields will be the same. The use of differing pulse patterns facilitates identifying the individual SAW tags in an ensemble of such tags. The B0 and B1 fields were selected to use for the scrambling codes in the illustrated example, because it is assumed that they will change from one ensemble of SAW tags to another. To avoid using the same scrambling code in multiple fields, the code is shifted to produce different codes in S0 through S6. Thus, even though unscrambled fields might be identical, the scrambled codes will not be identical.

The SAW tag response signal format of a 64-bit data code is shown in Table 5. The generic fields of the 64-bit code shown in Table 5 are transmitted in the order B0 to B3 followed by the scrambled fields S0 to S6. The transmission of the 16 Error Check bits will follow the 64-bit data field.

TABLE 5

64-Bit Unscrambling

| 80 Bits ||||||||||||||
|---|---|---|---|---|---|---|---|---|---|---|---|---|---|
| 64-Bit Data Field ||||||||||| Error Check |||
| 6 | 6 | 6 | 6 | 6 | 6 | 6 | 6 | 6 | 6 | 4 | 6 | 6 | 4 |
| B0 | B1 | B2 | B3 | S0 | S1 | S2 | S3 | S4 | S5 | S6 | EC0 | EC1 | EC2 |

Assuming B0 and B1 are received correctly (as subsequently verified by the error check), the scrambled fields can be unscrambled by reversing the process used in scrambling, as illustrated in Table 6.

TABLE 6

64-Bit Unscrambling Process

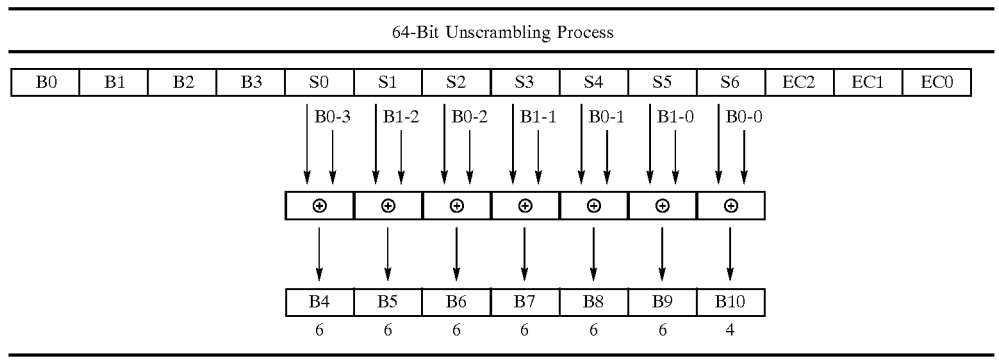

Figure 3:
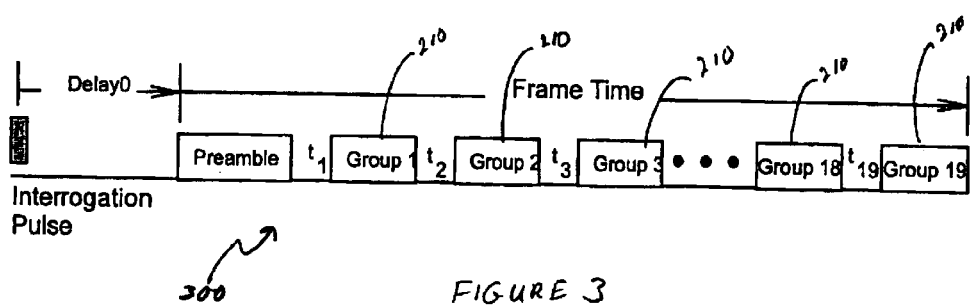
FIG. 3 illustrates a representative layout of an embodiment of a SAW tag utilizing nineteen groups of reflector locations on the substrate to encode up to 112 bits of data.

Turning now to FIG. 3, illustrated is a representative layout 300 of an embodiment of a SAW tag utilizing nineteen groups 210 of reflector locations to encode up to 112 bits of data. The illustrated embodiment provides for the first twelve groups 210 to use 2-of-21 encoding while the last two groups 210 use 1-of-16. Thus the fourteen groups 210 provide for 80 bits of data encoding(12×6 plus 2×4=80). Eighteen groups of 2-of-21 encoding plus one group of 1-of-16 encoding provide the 112 bits of data, which can be encoding as 96 bits of EPC code and 16 bits of error check. Encoding this embodiment is fundamentally the same as encoding the embodiment illustrated in FIG. 2.

Although the present invention has been described in detail, those skilled in the art should understand that they can make various changes, substitutions and alterations herein without departing from the spirit and scope of the invention in its broadest form.

What is claimed is:

1. A system for determining an identifier on a surface acoustic wave (SAW) identification tag, comprising:
   generating a radio frequency (RF) interrogation signal that causes a transducer located on a piezoelectric substrate to produce an initial acoustic pulse that reflects off of a plurality of reflectors arranged according to time and phase position on said substrate to yield response acoustic pulses, said transducer generating an RF response signal from said response acoustic pulses;
   determining said identifier by decoding said RF response signal in view of predefined time, phase and amplitude parameters.

2. The system as recited in claim 1 wherein said RF interrogation signal has a carrier frequency of about 2.44 GHz.

3. The system as recited in claim 1 further comprising a group of reflector locations on said substrate.

4. The system as recited in claim 3 wherein a plurality of said groups are located on said substrate.

5. The system as recited in claim 4 wherein fourteen of said groups are located on said substrate.

6. The system as recited in claim 5 wherein up to 80 bits of data are encoded on said identification tag.

7. The system as recited in claim 4 wherein nineteen of said groups are located on said substrate.

8. The system as recited in claim 7 wherein up to 112 bits of data are encoded on said identification tag.

9. The system as recited in claim 3 wherein said group is comprised of 21 of said locations having two of said reflectors arranged therein separated by a minimum of ten reflector locations.

10. The system as recited in claim 3 wherein said group is comprised of 16 of said locations having a single reflector arranged therein.

11. A method of operating a system for determining an identifier on a surface acoustic wave (SAW) identification tag, comprising:

causing a radio frequency (RF) interrogation signal to be generated that excites a transducer located on a piezoelectric substrate into producing an initial acoustic pulse that reflects off of a plurality of reflectors arranged according to time and phase position on said substrate to yield response acoustic pulses, said transducer generating an RF response signal from said response acoustic pulses;

detecting said RF response signal and decoding said identifier from said RF response signal in view of predefined time, phase and amplitude parameters.

12. The method as recited in claim 11 wherein said RF interrogation signal has a carrier frequency of about 2.44 GHz.

13. The method as recited in claim 11 further comprising a group of reflector locations on said substrate.

14. The method as recited in claim 13 wherein a plurality of said groups are located on said substrate.

15. The method as recited in claim 14 wherein fourteen of said groups are located on said substrate.

16. The method as recited in claim 15 wherein up to 80 bits of data are encoded on said identification tag.

17. The method as recited in claim 14 wherein nineteen of said groups are located on said substrate.

18. The method as recited in claim 17 wherein up to 112 bits of data are encoded on said identification tag.

19. The method as recited in claim 13 wherein said group is comprised of 21 of said locations having two of said reflectors arranged therein separated by a minimum of ten reflector locations.

20. The method as recited in claim 13 wherein said group is comprised of 16 of said locations having a single reflector arranged therein.

* * * * *